(12) United States Patent
Lewis

(10) Patent No.: US 7,209,534 B2
(45) Date of Patent: Apr. 24, 2007

(54) FRACTIONAL DIVIDER SYSTEM AND METHOD

(75) Inventor: Michael Lewis, Märsta (SE)

(73) Assignee: Infineon Technologies AG, Munich (DE)

( * ) Notice: Subject to any disclaimer, the term of this patent is extended or adjusted under 35 U.S.C. 154(b) by 43 days.

(21) Appl. No.: 11/154,095

(22) Filed: Jun. 16, 2005

(65) Prior Publication Data
US 2006/0001498 A1    Jan. 5, 2006

(30) Foreign Application Priority Data
Jun. 30, 2004   (EP)  ................................. 04015423

(51) Int. Cl.
*H03K 21/00*    (2006.01)
*H03K 23/00*    (2006.01)

(52) U.S. Cl. .......................................... 377/47; 377/48

(58) Field of Classification Search ............. None
See application file for complete search history.

(56) References Cited

U.S. PATENT DOCUMENTS

| | | | |
|---|---|---|---|
| 6,075,834 A * | 6/2000 | Kojima et al. | ................. 377/47 |
| 6,449,329 B1 | 9/2002 | Halter | |
| 6,504,498 B1 | 1/2003 | O'Brien | |
| 6,725,067 B1 | 4/2004 | Marx et al. | |
| 6,882,698 B2 * | 4/2005 | Mukaide | ..................... 377/48 |
| 2001/0027096 A1 | 10/2001 | Lindlar | |

FOREIGN PATENT DOCUMENTS

EP            0 954 105 A1    11/1999

* cited by examiner

Primary Examiner—Tuan T. Lam
(74) Attorney, Agent, or Firm—Eschweiler & Associates, LLC

(57) ABSTRACT

The present invention relates to a fractional divider system for a low-power timer with reduced timing error at wake-up. The fractional divider system includes a fractional divider circuit operable to produce an output signal. The fractional divider system also includes a high speed crystal oscillator connected to the fractional divider circuit operable to start on wake-up from the low power mode, and a high speed clock divider circuit connected to the high speed crystal oscillator circuit. The high speed crystal oscillator circuit is configured to sample the output signal and a current state of the total timing error from the fractional divider circuit. The sampled output signal is employed to trigger the high speed clock divider circuit and the sampled current state of the total timing error preloads the high speed clock divider circuit, which is operable to synchronize a first pulse of the output signal to the ideal clock timing to an accuracy within 1.5 periods of the high speed clock.

16 Claims, 7 Drawing Sheets

| Output cycle | Selection | Time of next output (reference clocks) | Ideal time of next output (reference clocks) | Error | New accumulator |
|---|---|---|---|---|---|
| 0 | M | M | M+0.1 | 0.1 | 1 |
| 1 | M | 2M | 2M+0.2 | 0.2 | 2 |
| 2 | M | 3M | 3M+0.3 | 0.3 | 3 |
| 3 | M | 4M | 4M+0.4 | 0.4 | 4 |
| 5 | M | 5M | 5M+0.5 | 0.5 | 5 |
| 6 | M | 6M+1 | 6M+0.6 | -0.4 | -4 |
| 7 | M | 7M+1 | 7M+0.7 | -0.3 | -3 |
| 8 | M | 8M+1 | 8M+0.8 | -0.2 | -2 |
| 9 | M | 9M+1 | 9M+0.9 | -0.1 | -1 |
| 10 | M | 10M+1 | 10M+1 | 0 | 0 |

Fig. 2

FRACTIONAL DIVIDER SYSTEM AND METHOD

REFERENCE TO RELATED APPLICATIONS

This application claims the benefit of the priority date of European patent application EP 04 015 423.9, filed on Jun. 30, 2004, the contents of which are herein incorporated by reference in their entirety.

FIELD OF THE INVENTION

The present invention relates to a fractional divider system for a low-power timer with reduced timing error at wakeup, and to a method for reducing timing error at wakeup for a low-power timer.

BACKGROUND OF THE INVENTION

Low power devices are often designed such that they exploit periods of inactivity to deactivate non-necessary functions and enter an "idle" mode. For instance, it is common to deactivate the high speed crystal oscillator (operating at 10s of MHz) that provides the timing reference for the digital and also possibly analogue components. This reduces the power consumption of the device dramatically.

In many cases, it is necessary to be able to maintain an accurate timing reference during this idle period. For instance, a communications protocol implemented by the device may require that the device is reactivated to either send or receive messages at a particular point in time. Alternatively, if the device is woken up by an external signal, it may be necessary to determine accurately how much time has elapsed since the device entered low power mode.

An example of such a device is a Bluetooth communications circuit. The Bluetooth standard requires the maintenance of a transmission slot timer (control clock) operating at a rate of 1.6 kHz, which is allowed a maximum frequency drift of 250 ppm while in low power mode and a maximum timing jitter of 10 μs on awakening. This timer is used to determine when the device should awaken to receive or transmit data.

Typically, when the Bluetooth device is embedded in a larger system such as a mobile phone, there will be an external timing reference available during the low power mode. Such a reference is typically derived from a 32.768 kHz crystal oscillator, which consumes little power and is extremely cheap. Alternatively, an internal low-frequency oscillator may be used.

One approach is to make use of the low-power reference signal directly to determine when to leave low power mode. However, this requires that, e.g., software calculate the number of low power reference clock cycles that corresponds to the required number of control clock cycles prior to entering low power mode, and then calculate a further fractional correction on leaving low power mode. This requires processing time, which limits the amount of time that can be spent in the low power mode.

An alternative approach is to use a fractional divider circuit to derive the 1.6 kHz control clock from the available low-power reference signal. A fractional divider circuit produces an output signal with frequency $F_C$ with the following relationship to the reference clock frequency $F_{LP}$:

$$F_{LP} = \left(M + \frac{N}{P_{DIV}}\right) \times F_C$$

$P_{DIV}$ is the period of the fractional divider, M is the integer part of the division ratio, and N is the magnitude of the fractional part ($N < P_{DIV}$). The ratio is generally determined once for a given input and output frequency, and so does not represent a continuous overhead.

A standard implementation of a fractional divider is based on a simple integer divider (which generates a single output pulse once every M input pulses), with the integer division ratio alternated between M and (M+1) such that, over $P_{DIV}$ output clocks, the average division ratio is correct. An example of a digital circuit to perform this operation is shown in prior art FIG. 1. In FIG. 1 there is disclosed a fractional divider means 102 operable to produce an output signal with a frequency $F_C$ with the following relation to a reference clock frequency $F_{LP}$:

$$F_{LP} = \left(M + \frac{N}{P_{DIV}}\right) * F_C$$

The fractional divider means 102 comprises an accumulator means 108 operable to keep track of the total timing error. The fractional divider means 102 also comprises an integer divider means 112 connected to the accumulator means 108 and to a reference clock A operable to divide the reference clock A with an integer division ratio of either M or M+1. The fractional divider means 102 also comprises a ratio selector means 114 connected to the integer divider means 112 operable to keep the total timing error minimised symmetrically around zero. The fractional divider means 102 also comprises an adding means 120 connected to the accumulator means 108, a subtracting means 122 connected to the accumulator means 108, and a multiplexer means 124 connected to the adding means 120, the subtracting means 122 and the ratio selector means 114. As is apparent from FIG. 1, the adding means 120 and the subtracting means 122 are also connected to the ratio selector means 114. The output clock from the fractional divider means 102 is denoted B.

Every time a division ratio of M is selected, the output clock is produced with a period that is $N/P_{DIV}$ input clock cycles shorter than the ideal output clock period. Alternatively, when a division ratio of M+1 is selected the output clock is produced with a period that is $(1-N/P_{DIV})$ input clock cycles longer than the ideal output clock period. The accumulator 108 is used to keep track of the total timing error: every time a division ratio of M is used, the accumulator is incremented by N, while every time a division ratio of M+1 is used, the accumulator is decremented by ($P_{DIV}-N$). At the beginning of each output clock cycle, the circuit 114 determines which division ratio (M or M+1) will cause the least timing error with respect to the ideal clock output, and uses that division ratio.

An example of how this is performed is shown in prior art FIG. 2. In this example, the fractional part is set to 0.1 (i.e., N=1, $P_{DIV}=10$). To generate the first cycle of the output clock, a division ratio of M is chosen. This results in an error of 0.1 (i.e., the output clock is produced 0.1 periods of input clock too early). Had the ratio M+1 been used, the resulting output clock would instead have come 0.9 input clock cycles too late. At the beginning of each new output clock cycle, the same decision is made with the error gradually accumulating. By output cycle 4, the error has reached 0.5 (corresponding to an accumulator value 5): at this stage, choosing a division ratio of M would produce an error of +0.6, while choosing a ratio of M+1 would produce a smaller absolute error of −0.4. Hence, the circuit chooses a division ratio M+1.

The problem with this method of clock division is that, at any given instant, the error (jitter) from the output clock to the ideal clock can be up to half of an input clock cycle. For the case of a 32.768 kHz clock this would result in a jitter of 15 μs, which violates the 10 μs jitter requirements for the Bluetooth control clock.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to solve the above-mentioned problems associated with the prior art. This is achieved with a fractional divider system for low-power timer with reduced timing error at wakeup that comprises a fractional divider operable to produce an output signal with a frequency $F_C$ with the following relation to a reference clock frequency $F_{LP}$:

$$F_{LP} = \left(M + \frac{N}{P_{DIV}}\right) \times F_C$$

wherein $P_{DIV}$ is the period of the fractional divider, M is the integer part of the division ratio, and N is the magnitude of the fractional part of the division ratio. The fractional divider system also comprises a high speed crystal oscillator connected to the fractional divider means operable to start on wakeup from the low-power mode. The fractional divider system also comprises a high speed clock divider connected to the fractional divider and to the high speed crystal oscillator. The high speed crystal oscillator is also operable to sample the output signal and sample a current state of the total timing error from the fractional divider. The sampled output signal triggers the high speed clock divider and the sampled current state of the total timing error preloads the high speed clock divider, which is operable to synchronize the first pulse of the output clock signal to the ideal clock timing to an accuracy within 1.5 periods of the high speed clock.

An advantage of the fractional divider system according to one embodiment of the present invention is that the timing jitter due to the fractional divider system can be reduced to 1.5 high speed clock cycles, i.e., a small fraction of a microsecond. This means that the jitter is effectively zero compared to other sources of error, e.g., drift in the reference clock frequency.

Another advantage with the fractional divider system according to another embodiment of the present invention is that it is implemented with very low hardware complexity.

A further advantage in one embodiment is achieved if the fractional divider comprises an accumulator operable to keep track of the total timing error, and wherein the fractional divider system also comprises a counter operable to count the number of high speed clocks from the ideal timing reference to the first pulse of the low power reference clock, thereby measuring the timing error. The measured timing error is used to adjust the value in the accumulator such that the late start of the measurement is compensated for.

In one embodiment, a further advantage is achieved if the measured timing error is used by the accumulator to adjust the preload value for the high speed clock divider on leaving the low-power mode.

A further advantage in an embodiment is achieved if the fractional divider system also comprises a wake-up timer connected to the high speed crystal oscillator operable to bring the fractional divider system out of low-power mode, either due to the expiration of the wake-up timer or due to an external signal requesting that the fractional divider system wakes up.

According to another embodiment of the invention, a further advantage is achieved if the fractional divider system also comprises an integer divider connected to the wake-up timer operable to divide the reference clock with an integer division ratio of either M or M+1.

A further advantage in another embodiment is achieved if the fractional divider system also comprises a ratio selector connected to the integer divider operable to keep the total timing error as small as possible while being positive.

In accordance with another embodiment, a further advantage is achieved if the current timing error value stored in the accumulator is denoted k, wherein the number of cycles of the high speed clock required for the value k is given as:

$$n_{HS} = k \frac{T_{LP}}{P_{DIV} T_{HS}}$$

wherein $T_{LP}$ is the time period for the low-power reference clock, and $T_{HS}$ is the time period for the high speed crystal oscillator, with the values $T_{LP}$, $T_{HS}$ and $T_{LP}$ chosen such that the number of high speed clock cycles required is a convenient integer multiple of the value k.

A further advantage is achieved in another embodiment if the fractional divider system also comprises a first synchronizer connected to the accumulator, the high speed crystal oscillator and the high speed clock divider, wherein the first synchronizer outputs the preload value to the high speed clock divider.

In accordance with yet another embodiment of the invention, a further advantage is achieved if the fractional divider system also comprises a second synchronizer connected to the integer divider, the high speed crystal oscillator and the high speed clock divider, wherein the output from the second synchronizer triggers the high speed clock divider.

A further advantage is achieved if the fractional divider system also comprises an adder connected to the accumulator, a subtractor connected to the accumulator, and a multiplexer connected to the adder, the subtractor and the ratio selector, wherein the output from the multiplexer is input to the accumulator.

The above-mentioned problems associated with the prior art are also solved with a method for reducing timing error at wakeup for low-power timer. The method comprises producing an output signal with a frequency $F_C$ with the following relation to a reference clock frequency $F_{LP}$;

$$F_{LP} = \left(M + \frac{N}{P_{DIV}}\right) \times F_C$$

wherein $P_{DIV}$ is the period of a fractional divider, M is the integer part of the division ratio, and N is the magnitude of the fractional part of the division ratio. The method further comprises sampling the output signal, sampling a current state of the total timing error, and triggering a high speed clock divider with the sampled output signal. The method also comprises preloading the high speed clock divider with the sampled current state of the total timing error, and synchronizing a first pulse of the output clock signal to the ideal clock timing to an accuracy within 1.5 periods of the high speed clock.

An advantage with the method for reducing timing error at wakeup for low-power timer according to the present invention is that the timing jitter due to the method can be reduced to 1.5 high speed clock cycles, i.e., a small fraction of a microsecond. This means that the jitter is effectively zero compared to other sources of error, e.g., drift in the reference clock frequency.

A further advantage is achieved in accordance with another embodiment of the invention if the method also comprises counting the number of high speed clocks from the ideal timing reference to the first pulse of the low-power reference clock, and adjusting the preload value such that the late start of the measurement is compensated for.

A further advantage is achieved if the method also comprises exiting the low-power mode, either due to the expiration of a wake-up time means, or due to an external signal requesting wake up.

A further advantage is achieved if the method also comprises dividing the reference clock with an integer division ratio of either M or M+1.

A further advantage is achieved if the method also comprises selecting the integer division ratio in such a way to keep the total timing error as small as possible while being positive.

A further advantage is achieved if the current timing error is denoted k, and the number of cycles of the high speed clock required for the value k is given as:

$$n_{HS} = kX \frac{T_{LP}}{P_{DIV} T_{HS}}$$

wherein $T_{LP}$ is the time period of a low-power reference clock, and $T_{HS}$ is the time period for a high speed crystal oscillator, with the values $T_{LP}$, $T_{HS}$ and $T_{LP}$ chosen such that the number of high speed clock cycles required is a convenient integer multiple of the value k.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The present invention will in the following by way of embodiments be described in more detail, in conjunction with the enclosed drawings, in which:

FIG. 2 discloses in the form of Table 1 the operation of the fractional divider means disclosed in prior art FIG. 1;

DETAILED DESCRIPTION OF THE INVENTION

Figure 3:
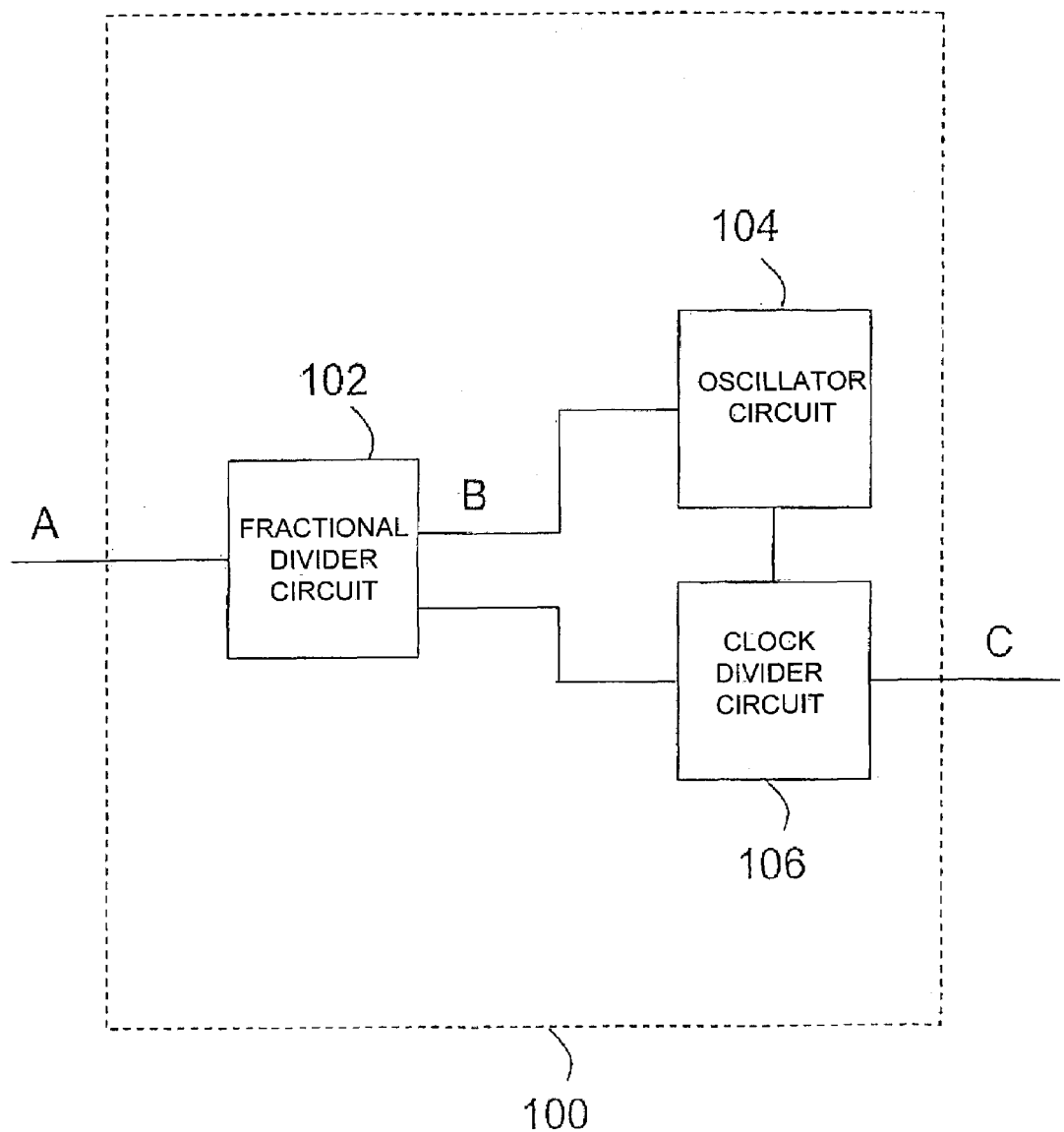
FIG. 3 is a block diagram of a fractional divider system according to one embodiment of the present invention.

In FIG. 3 there is disclosed a block diagram of a fractional divider system 100 for a low-power timer with reduced timing error at wakeup according to the present invention. The fractional divider system 100 comprises a fractional divider circuit 102 operable to produce an output signal B with a frequency $F_C$ with the following relation to a reference clock frequency $F_{LP}$:

$$F_{LP} = \left(M + \frac{N}{P_{DIV}}\right) \times F_C$$

wherein $P_{DIV}$ is the period of the fractional divider circuit 102, M is the integer part of the division ratio, and N is the magnitude of the fractional part of the division ratio. The input signal to the fractional divider circuit 102 is denoted A. The fractional divider system 100 also comprises a high speed crystal oscillator connected to the fractional divider circuit 102 operable to start on wakeup from the low power mode. The fractional divider system 100 also comprises a high speed clock divider circuit 106 connected to the fractional divider circuit 102 and to the high speed crystal oscillator circuit 104. The high speed crystal oscillator circuit 104 is also operable to sample the output signal B and a current state of the total timing error from the fractional divider circuit 102. The sampled output signal B triggers the high speed clock divider circuit 106 and the sampled current state of the total timing error preloads the high speed clock divider circuit 106. The high speed clock divider circuit 106 is operable to synchronize the first pulse of the output clock signal C to the ideal clock timing to an accuracy within 1.5 periods of the high speed clock.

Figure 1:
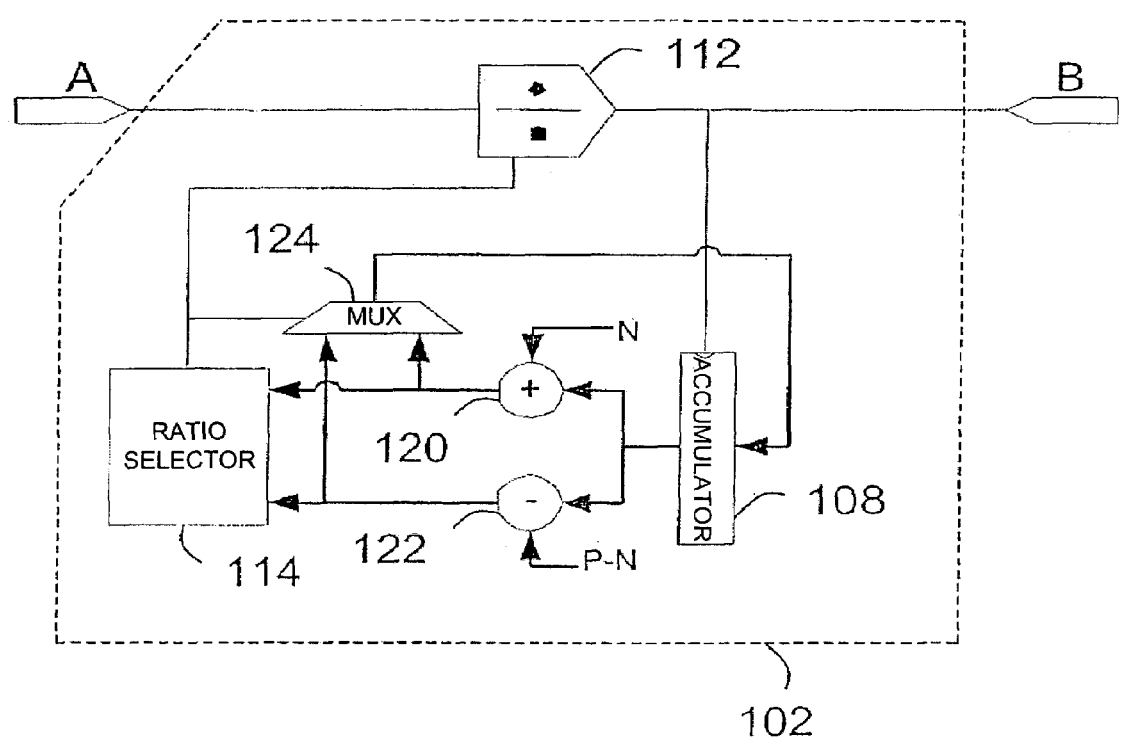
FIG. 1 is a block diagram of a fractional divider means according to the prior art.
Figure 4:
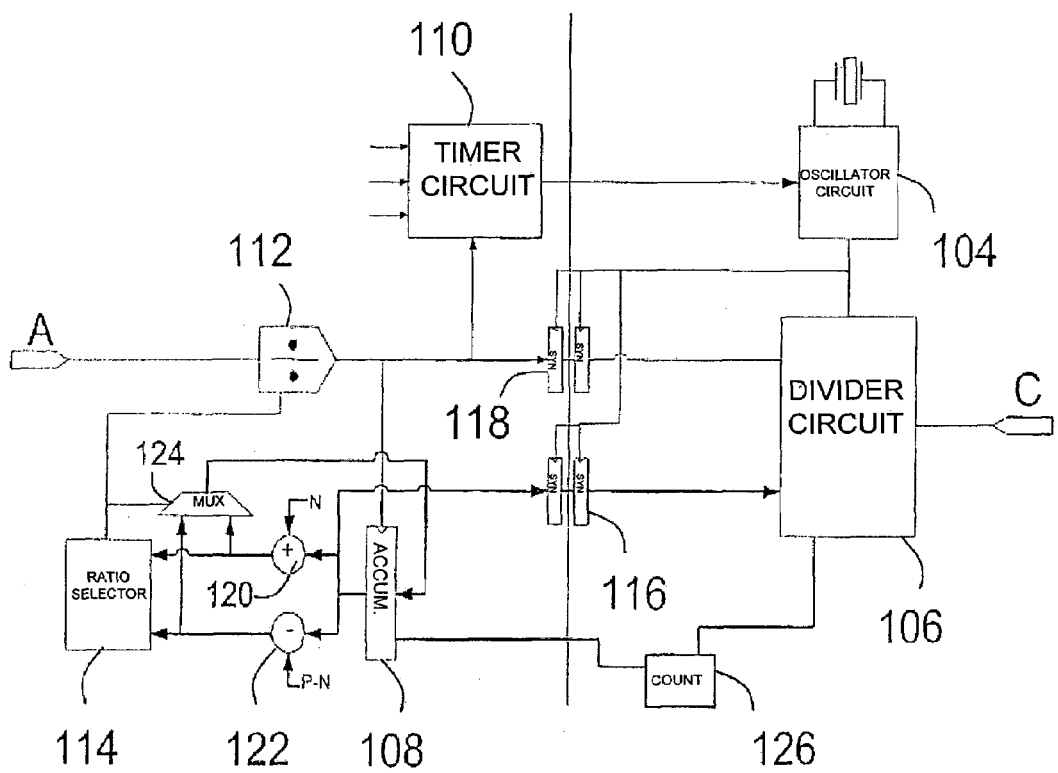
FIG. 4 is a more detailed block diagram of the fractional divider system disclosed in FIG. 3 according to another embodiment of the invention.

In FIG. 4 there is disclosed a more detailed block diagram of the fractional divider system 100 disclosed in FIG. 3 according to another embodiment of the present invention. Some of the functional blocks in FIG. 4 corresponds to the same functional blocks in FIGS. 1 and 3 and these have been allocated the same reference signs in FIGS. 1, 3 and 4 and will not be described again. The fractional divider system 100 disclosed in FIG. 4 also comprises a wake-up timer circuit 110 connected to the high speed crystal oscillator circuit 104 operable to bring the fractional divider system 100 out of the low-power mode. This is performed either due to the expiration of the wake-up timer circuit 110, or due to an external signal requesting that the fractional divider system 100 wakes up. The fractional divider system 100 also comprises a ratio selector circuit 114 connected to the integer divider circuit 112 operable to keep the total timing error as small as possible while being positive.

The fractional divider system 100 also comprises a first synchronizer circuit 116 connected to the accumulator circuit 108, the high speed crystal oscillator circuit 104, and the high speed clock divider circuit 106. The first synchronizer circuit 116 outputs the preload value to the high speed clock divider circuit 106. The fractional divider system 100 also comprises a second synchronizer circuit 118 connected to the integer divider circuit 112, the high speed crystal oscillator circuit 104, and the high speed clock divider circuit 106. The output from the second synchronizer circuit 118 triggers the high speed clock divider circuit 106. The fractional divider system also comprises a counter 126 connected to the high speed clock divider circuit 106, wherein the counter 126 is operable to count the number of high-speed clocks from the ideal timing reference to the first pulse of the low power reference clock, thereby measuring the timing error, which is used to adjust the value in the accumulator circuit 108 such that the late start of the measurement is compensated for. As is apparent from FIG. 4, the counter 126 is also connected to the accumulator circuit 108.

According to another embodiment, the measured timing error is used by the accumulator circuit 108 to adjust the preload value for the high speed clock divider circuit 106 upon leaving the low-power mode.

If the current timing error value stored in the accumulator circuit 108 is denoted k, the number of cycles of the high speed clock required for the value k is given as:

$$n_{HS} = k \times \frac{T_{LP}}{P_{DIV} T_{HS}}$$

wherein $T_{LP}$ is the time period for the low-power reference clock, and $T_{HS}$ is the time period for the high speed crystal oscillator circuit 104 with the values $T_{LP}$, $T_{HS}$ and $P_{DIV}$ chosen such that the number of high speed clock cycles required is a convenient integer multiple of the value k. Below will follow a description of the fractional divider system 100 according to the present invention.

The invention is a modification to the prior art fractional division circuit, wherein in the present invention the high speed crystal oscillator that is activated upon the return from low-power mode is used to compensate for the timing error recorded in the accumulator. This means that the timing jitter due to the fractional divider can be reduced to 1.5 high-speed clock cycles, i.e., a small fraction of a microsecond. This means that the jitter is effectively zero compared to other sources of error (e.g., drift in the reference clock frequency).

The aim of the improved low-power timer circuit of the present invention is to make use of the timing error that is stored in the fractional divider's accumulator, so that on exit from low-power mode (either due to reaching the programmed sleep duration or due to an external wake-up signal) the next pulse of the control clock is accurately aligned.

The improved low-power timer circuit is shown in FIG. 4. The structure of the fractional divider itself is essentially unchanged. However, instead of attempting to keep the error minimised symmetrically around zero, the ratio selector of the present invention attempts to keep the error as small as possible while always being positive (i.e., the output clock always occurs slightly in advance of the ideal clock instant).

On wake-up from the low power mode, the high speed crystal oscillator is started by the wake-up timer circuit 110. The oscillator 104 is used to sample the output of the fractional divider and the current state of the accumulator, which are then passed to a high-speed clock divider 106 which, in active mode, is responsible for maintaining the control clock. On leaving low power mode, the high-speed clock divider 106 waits for a rising edge on the sampled low-power control clock. This is used to preload the high-speed divider with a value derived from the sampled timing error (accumulator of the fractional divider), such that the first pulse on the output clock is synchronized to the ideal clock timing to within 1.5 periods of the high-speed clock, which is negligible compared to other sources of timing error.

Denoting the current timing error value stored in the accumulator 108 as k, the number of cycles of the high-speed clock required for a given accumulator value is given as:

$$n_{HS} = k \times \frac{T_{LP}}{P_{DIV} T_{HS}}$$

By selecting $P_{DIV} = T_{LP}/T_{HS}$, the right hand side of the equation becomes equal to one, i.e., no multiplication or division operation is needed to calculate the appropriate preload value. Alternatively, $P_{DIV}$ could be chosen such that the multiplication factor becomes a power of two (i.e., a simple shift operation), allowing more flexibility in how coarse a division ratio is implemented. It may also be desirable to subtract a constant offset from the preload value to compensate for the delay through the synchronizer and possible delays in other parts of the circuit and such alternatives are contemplated as falling within the scope of the present invention.

The wake-up timer 110 shown in FIG. 4 is responsible for bringing the system out of low-power mode, either due to expiration of the timer or due to an external signal requesting that the device wakes up. The wake-up timer 110 is clocked by the low power reference clock, and counts the number of control clock pulses generated by the fractional divider. The generation of the enable signal to the crystal oscillator 104 is timed such that the crystal oscillator has time to stabilise before the flank of the control clock that represents the programmed wake-up instant. In the event of an external wake-up signal, the number of elapsed control clocks may be read out by the system after receiving the trigger pulse to the high-speed clock divider.

The improved circuit of the present invention as described so far may be further improved according to another embodiment. It is desired to maintain a timing reference defined relative to the high-speed clock: however, the low power timing reference is derived from the 32 kHz reference clock and this is asynchronous to the high-speed clock. Therefore, there is an unknown delay of up to an entire reference clock cycle before the first pulse into the low-power fractional divider, which if uncorrected would directly translate into jitter of the output clock.

This problem is remedied in accordance with one embodiment of the invention by counting the number of high-speed clocks from the ideal timing reference to the first pulse of the 32 kHz clock, thereby measuring the timing error. This count may then be used to adjust the value in the accumulator of the fractional divider such that the late start of the measurement is compensated for, or may be used to adjust the preload value for the high-speed clock divider on leaving low-power mode. In both cases, measures may be taken to ensure that the required preload value for the high speed divider is non-negative (i.e., the output pulse from the low power divider arrives too late). This can be done by adjusting the division ratio for the first control clock pulse, and, if the preload adjustment is used, setting the target range of the timing error such that the control clock pulses from the low power divider are always sufficiently in advance of the ideal timing.

This circuit, with very low hardware complexity, allows for a timing reference to be maintained during a low power state which is limited essentially only by the drift of the external low power reference, e.g., some 10s of parts per million for a typical 32 kHz clock.

Figure 5:
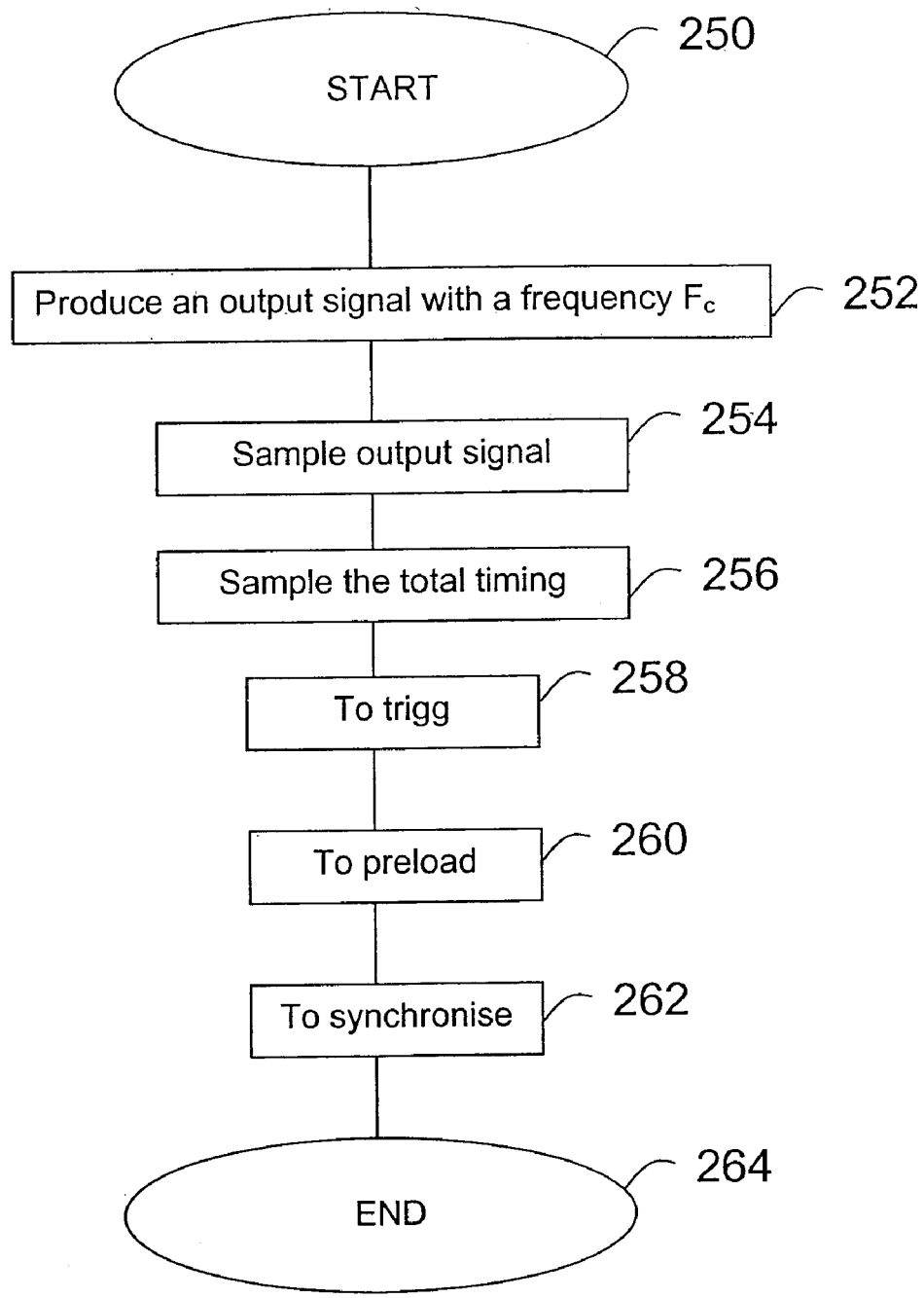
FIG. 5 is a flow chart of a method for reducing timing error at wakeup for low-power timer according to one embodiment of the present invention.

In FIG. 5 there is disclosed a flow chart of a method for reducing timing error at wakeup for a low-power timer according to the present invention. The method begins at block 250. The method continues at 252 with a production of an output signal with a frequency $F_C$ with the following relation to a reference clock frequency $F_{LP}$:

$$F_{LP} = \left(M + \frac{N}{P_{DIV}}\right) \times F_C$$

wherein $P_{DIV}$ is the period of the fractional divider circuit, M is the integer part of the division ratio, and N is the magnitude if the fractional part of the division ratio. In one example the output signal is produced with a fractional divider circuit. Thereafter, the method continues at 254 with a sampling of the output signal. The method continues at 256 with a sampling of a current state of the total timing error. Thereafter, the method continues at 258 with a triggering, with the sampled output signal, of a high speed clock divider circuit. The method continues at 260 with a preloading of the high speed clock divider circuit with the sampled current state of the total timing error. Thereafter, the method continues at 262 with a synchronization of the first pulse of the output clock signal to the ideal clock timing to an accuracy within 1.5 periods of the high speed clock. The method is finished at 264.

Figure 6:
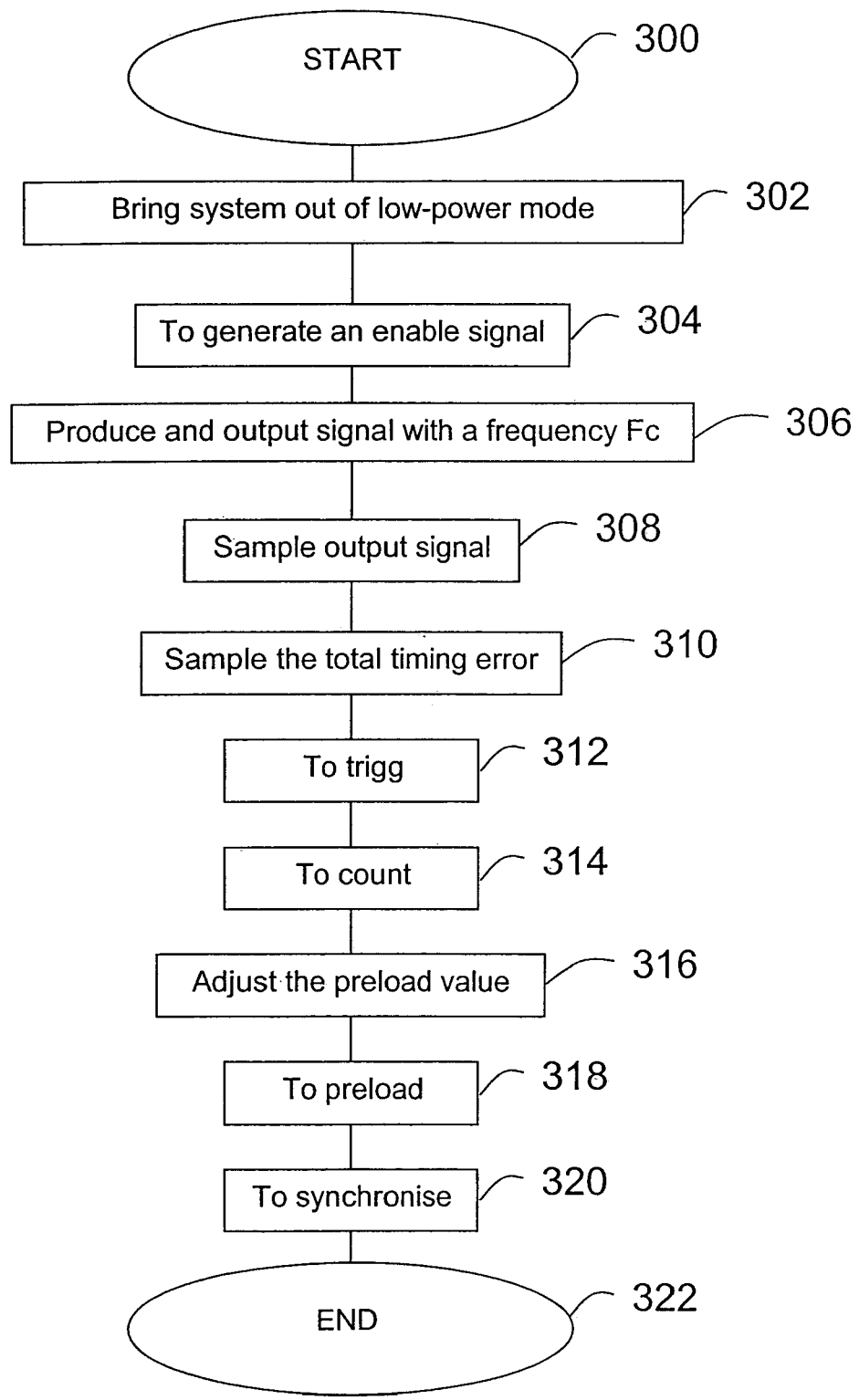
FIG. 6 is a more detailed flow chart of the method disclosed in FIG. 5 according to another embodiment of the invention.

In FIG. 6 there is disclosed a more detailed flow chart of the method disclosed in FIG. 5 in accordance with another embodiment of the invention. The method begins at 300 and continues at 302 with an exit out of a low-power mode, either due to expiration of a timer or due to an external signal requesting that the system wakes up. Thereafter, the method continues at 304 with the generation of an enable signal to a high speed crystal oscillator circuit. The method continues at 306 with production of an output signal with a frequency $F_C$ with the following relation to a reference clock frequency $F_{LP}$:

$$F_{LP} = \left(M + \frac{N}{P_{DIV}}\right) \times F_C$$

wherein $P_{DIV}$ is the period of the fractional divider circuit, M is the integer part of the division ratio, and N is the magnitude of the fractional part of the division ratio. Thereafter, at 308 the output signal is sampled. The method continues at 310 with a sampling of a current state of the total timing error.

Thereafter, the method continues at 312 with a triggering of a high speed clock divider circuit with the sampled output signal. The method continues at 314 by counting the number of high-speed clocks from the ideal timing reference to the first pulse of the low-power reference clock. Thereafter, the method continues at 316 with an adjustment of the preload value such that the late start of the measurement is compensated for. The method continues at 318 with a preloading of the high speed clock divider circuit with the adjusted preload value. Thereafter the method continues at 320 with the synchronization of the first pulse of the output clock signal to the ideal clock timing to an accuracy within 1.5 periods of the high speed clock. The method is finished at 322.

According to one embodiment, the method also comprises dividing the reference clock with an integer division ratio of either M or M+1.

According to another embodiment, the method further comprises selecting the integer division ratio in such a way to keep the total timing error as small as possible while remaining positive.

According to yet another embodiment of the method, if the current timing error is denoted k, the number of cycles of the high speed clock required for the value k is given as:

$$n_{HS} = k \times \frac{T_{LP}}{P_{DIV} T_{HS}}$$

wherein $T_{LP}$ is the time period of a low-power reference clock, and $T_{HS}$ is the time period for a high speed crystal oscillator circuit, with the values $T_{LP}$, $T_{HS}$ and $P_{DIV}$ chosen such that the number of high speed clock cycles required is a convenient integer multiple of the value k.

Figure 7:
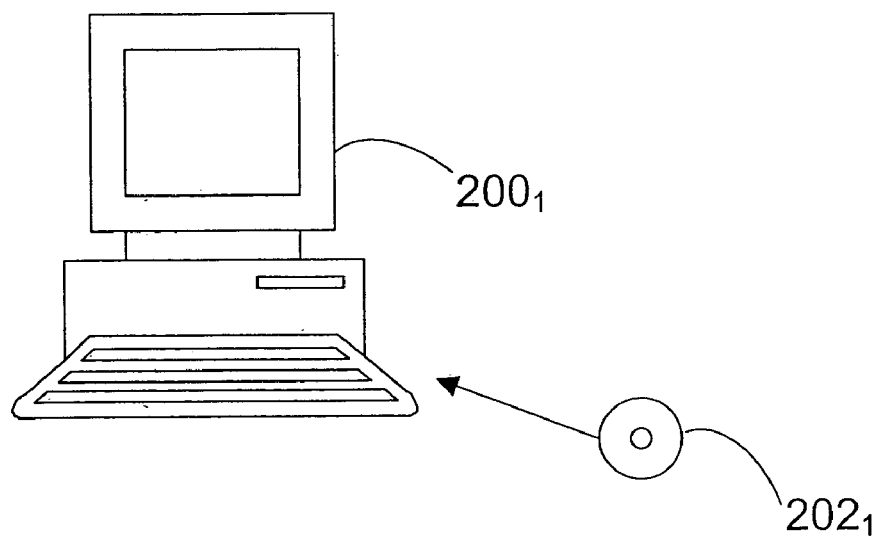
FIG. 7 show some examples of computer program products according to the present invention.
Figure 7:
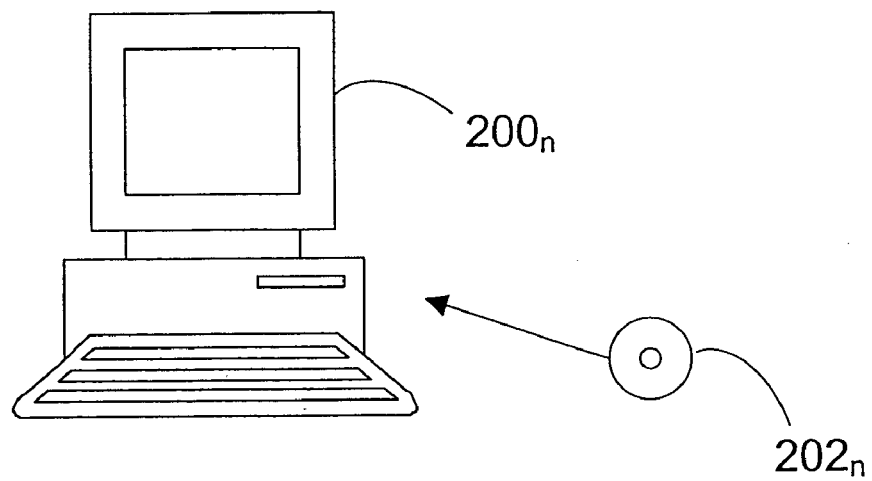

In FIG. 7 there is disclosed a schematic diagram of some computer program products according to the present invention. There is disclosed n different digital computers $200_1, \ldots, 200_n$, wherein n is an integer. There is also disclosed n different computer program products $202_1, \ldots, 202_n$, here showed in the form of compact discs. The different computer program products $202_1, \ldots 202_n$ are directly loadable into the internal memory of the n different digital computers $200_1, \ldots, 200_n$. Each computer program product $202_1, \ldots, 202_n$ comprises software code portions for performing some or all the steps of FIG. 5 when the product(s) $202_1, \ldots, 202_n$ is/are run on the computer(s) $200_1, \ldots, 200_n$. The computer program products $202_1, \ldots, 202_n$ can, e.g., be in the form of floppy disks, RAM disks, magnetic tapes, opto magnetical disks or any other suitable products.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A fractional divider system for a low-power timer with reduced timing error at wake-up from a low power mode, comprising:
   a fractional divider circuit configured to produce an output signal with a frequency $F_C$ with the following relation to a reference clock having a reference clock frequency $F_{LP}$:

$$F_{LP} = \left(M + \frac{N}{P_{DIV}}\right)F_c$$

wherein $P_{DIV}$ is a period of the fractional divider circuit, M is an integer part of a division ratio associated therewith, and N is the magnitude of a fractional part of the division ratio;
   a high speed crystal oscillator circuit connected to the fractional divider circuit and configured to start and generate a high speed clock signal based on a wake-up from the low power mode;
   a high speed clock divider circuit connected to the fractional divider circuit and to the high speed crystal oscillator circuit,
   wherein the high speed crystal oscillator circuit is further configured to sample the output signal and a current state of a total timing error associated with the fractional divider circuit using the high speed clock signal, and
   wherein the sampled output signal triggers the high speed clock divider circuit, and the sampled current state of the total timing error preloads the high speed clock divider circuit, and wherein the high speed clock divider circuit is further configured to synchronize a first pulse of the output clock signal to an ideal clock timing associated with an external reference clock to an accuracy within 1.5 periods of the high speed clock signal using the preloaded total timing signal.

2. The fractional divider system of claim 1, wherein the fractional divider circuit comprises an accumulator circuit configured to account for the total timing error associated with the fractional divider circuit, and wherein the fractional divider system further comprises a counter configured to count a number of high-speed clock periods between the ideal timing reference to the first pulse of the output clock signal, thereby measuring the timing error.

3. The fractional divider system of claim 2, wherein the accumulator circuit is configured to adjust the preload value for the high speed clock divider circuit upon leaving the low-power mode using the measured timing error from the counter.

4. The fractional divider system of claim 1, wherein the fractional divider system further comprises a wake-up timer connected to the high speed crystal oscillator circuit, and configured to activate and thus bring the fractional divider system out of the low power mode, either due to an expiration of a time identified by the wake-up timer or due to an external signal requesting that the fractional divider system wake up identified by the wake-up timer.

5. The fractional divider system of claim 1, wherein the fractional divider circuit further comprises an integer divider circuit connected to the wake-up timer circuit, and configured to divide the reference clock with an integer division ratio of either M or M+1.

6. The fractional divider system of claim 5, wherein the fractional divider circuit further comprises a ratio selector means connected to the integer divider circuit, and configured to minimize the total timing error associated with the fractional divider circuit and keep such total timing error positive.

7. The fractional divider system of claim 2, wherein a current timing error value stored in the accumulator circuit is denoted k, and wherein the number of cycles of the high speed clock required for the value k is given as:

$$n_{HS} = k\frac{T_{LP}}{P_{DIV}T_{HS}}$$

wherein $T_{LP}$ is the time period for the reference clock, and $T_{HS}$ is the time period for the high speed crystal oscillator circuit, with the values $T_{LP}$, $T_{HS}$ and $P_{DIV}$ chosen such that a number of high speed clock cycles required is an integer multiple of the value k.

8. The fractional divider system of claim 7, wherein the fractional divider system further comprises a first synchronizer circuit connected to the accumulator circuit, the high speed crystal oscillator circuit, and the high speed clock divider circuit, wherein the first synchronizer circuit is configured to output the preload value to the high speed clock divider circuit at a predetermined time.

9. The fractional divider system of claim 8, wherein the fractional divider system further comprises a second synchronizer circuit connected to the integer divider circuit, the high speed crystal oscillator circuit, and the high speed clock divider circuit, wherein the second synchronizer circuit is configured to trigger the high speed clock divider circuit at a predetermined time.

10. The fractional divider system of claim 9, wherein the fractional divider circuit also comprises an adder connected to the accumulator circuit, a subtractor connected to the accumulator circuit, and a multiplexer circuit connected to the adder, the subtractor and the ratio selector circuit, wherein the output from the multiplexer circuit is input to the accumulator circuit.

11. A method for reducing timing error at wake-up for a low-power timer comprising a fractional divider circuit, comprising:
   producing an output signal with the fractional divider circuit with a frequency $F_C$ with the following relation to a reference clock signal having a reference clock frequency $F_{LP}$;

$$F_{LP} = \left(M + \frac{N}{P_{DIV}}\right)F_C$$

wherein $P_{DIV}$ is a period of the fractional divider circuit, M is an integer part of the division ratio, and N is a magnitude of the fractional part of the division ratio;

sampling the output signal with a high speed clock associated with a high speed oscillator circuit;

sampling a current state of a total timing error associated with the fractional divider circuit with the high speed oscillator circuit;

triggering a high speed clock divider circuit with the sampled output signal;

preloading the high speed clock divider circuit with the sampled current state of the total timing error; and synchronizing a first pulse of an output clock signal to an ideal clock timing of an external clock signal to an accuracy within 1.5 periods of the high speed clock using the preloaded state of the timing error.

12. The method of claim 11, further comprising:

counting a number of clock periods of the high speed clock between the ideal timing reference to the first pulse of the output clock signal; and adjusting the preload value based on the counted periods.

13. The method of claim 12, further comprising:

exiting a low power mode of the timer, either due to an expiration of a wake-up timer, or due to an external signal requesting wake up; and initiating the sampling in response to the exiting the lwo power mode.

14. The method of claim 13, further comprising dividing the reference clock with an integer division ratio of either M or M+1.

15. The method of claim 14, further comprising selecting an integer division ratio to divide such that a resultant timing error is minimized and remains positive.

16. The method of claims 11, wherein a current timing error is denoted k, and wherein a number of cycles of the high speed clock required for the value k is given as:

$$n_{HS} = k \frac{T_{LP}}{P_{DIV} T_{HS}}$$

wherein $T_{LP}$ is the time period of the output signal, and $T_{HS}$ is the time period for the high speed crystal oscillator circuit, with the values $T_{LP}$, $T_{HS}$ and $P_{DIV}$ chosen such that the number of high speed clock cycles required is an integer multiple of the value k.

\* \* \* \* \*